(12) United States Patent
Lee et al.

(10) Patent No.: US 7,683,380 B2
(45) Date of Patent: Mar. 23, 2010

(54) HIGH LIGHT EFFICIENCY SOLID-STATE LIGHT EMITTING STRUCTURE AND METHODS TO MANUFACTURING THE SAME

(75) Inventors: Cheng Tsin Lee, Richmond, CA (US);
Qinghong Du, Hercules, CA (US);
Jean-Yves Naulin, Richmond, CA (US)

(73) Assignee: Dicon Fiberoptics, Inc., Richmond, CA (US)

( * ) Notice: Subject to any disclaimer, the term of this patent is extended or adjusted under 35 U.S.C. 154(b) by 0 days.

(21) Appl. No.: 11/777,987

(22) Filed: Jul. 13, 2007

(65) Prior Publication Data
US 2008/0315220 A1 Dec. 25, 2008

Related U.S. Application Data

(60) Provisional application No. 60/937,245, filed on Jun. 25, 2007.

(51) Int. Cl.
| H01L 27/15 | (2006.01) |
| H01L 29/26 | (2006.01) |
| H01L 31/12 | (2006.01) |
| H01L 33/00 | (2006.01) |
| H01L 29/22 | (2006.01) |
| H01L 29/227 | (2006.01) |
| H01L 29/06 | (2006.01) |
| H01L 31/0328 | (2006.01) |
| H01L 31/0336 | (2006.01) |
| H01L 31/072 | (2006.01) |
| H01L 31/109 | (2006.01) |

(52) U.S. Cl. ............... 257/79; 257/13; 257/98; 257/99; 257/E25.028; 257/E25.032; 257/E33.001; 257/E33.002

(58) Field of Classification Search ............ 257/13, 257/79, 98–99, E25.028, E25.032, E33.001, 257/E33.002
See application file for complete search history.

(56) References Cited

U.S. PATENT DOCUMENTS 6,784,462 B2 * 8/2004 Schubert ............... 257/98

(Continued)

FOREIGN PATENT DOCUMENTS

| EP | 0 853 358 A2 | 7/1998 |
| EP | 853358 A2 * | 7/1998 |

OTHER PUBLICATIONS

Kim et al. "Omni-Directional Reflectors for Light-Emitting Diodes," Proc. of SPIE vol. 6134, 2006, pp. from D-1 to D-12.
Kim et al., "GaInN light-emitting diode with conductive omnidirectional reflector having a low-refractive-index indium-tin oxide layer," Applied Physics Letters 88, 013501, 2006, pp. 1-3.

*Primary Examiner*—Ida M Soward
(74) *Attorney, Agent, or Firm*—Davis Wright Tremaine LLP

(57) ABSTRACT

In one embodiment of an epitaxial LED device, a buffer layer (e.g. dielectric layer) between the current spreading layer and the substitute substrate includes a plurality of vias and has a refractive index that is below that of the current spreading layer. A reflective metal layer between the buffer layer and the substitute substrate is connected to the current spreading layer through the vias in the buffer layer. The buffer layer separates the current spreading layer from the reflective metal layer. In yet another embodiment, stress management is provided by causing or preserving stress, such as compressive stress, in the LED so that stress in the LED is reduced when it experiences thermal cycles. In one implementation of this embodiment, a layer is attached to the LED and reflective metal layer, and causes or preserves stress in the LED along one or more directions parallel to an interface between the LED epitaxial layers so that stress in the LED is reduced in said one or more directions when temperature of the structure is increased.

9 Claims, 7 Drawing Sheets

U.S. PATENT DOCUMENTS

| | | | |
|---|---|---|---|
| 6,825,895 B2* | 11/2004 | Nakano et al. | 349/63 |
| 6,838,704 B2* | 1/2005 | Lin et al. | 257/98 |
| 6,878,973 B2* | 4/2005 | Lowery et al. | 257/100 |
| 7,042,012 B2* | 5/2006 | Senda et al. | 257/79 |
| 7,053,413 B2* | 5/2006 | D'Evelyn et al. | 257/79 |
| 7,105,857 B2 | 9/2006 | Nagahama et al. | 257/86 |
| 7,119,372 B2* | 10/2006 | Stokes et al. | 257/79 |
| 7,186,580 B2 | 3/2007 | Tran et al. | 438/22 |
| 7,195,944 B2 | 3/2007 | Tran et al. | 438/46 |
| 7,244,957 B2* | 7/2007 | Nakajo et al. | 257/13 |
| 7,378,288 B2 | 5/2008 | Tran et al. | 438/12 |
| 7,405,431 B2* | 7/2008 | Aoyagi et al. | 257/79 |
| 7,413,918 B2 | 8/2008 | Tran et al. | 438/46 |
| 7,432,119 B2* | 10/2008 | Doan | 438/33 |
| 7,473,936 B2* | 1/2009 | Tran et al. | 257/95 |
| 7,524,686 B2* | 4/2009 | Chu et al. | 438/22 |
| 2004/0012732 A1* | 1/2004 | Sugiura | 349/65 |
| 2005/0019971 A1* | 1/2005 | Slater et al. | 438/33 |
| 2005/0151136 A1* | 7/2005 | Liu | 257/79 |
| 2006/0006554 A1 | 1/2006 | Yoo et al. | 257/213 |
| 2006/0154393 A1 | 7/2006 | Doan et al. | 438/26 |
| 2006/0189098 A1 | 8/2006 | Edmond | 438/460 |
| 2006/0237735 A1 | 10/2006 | Naulin et al. | 257/98 |
| 2006/0273324 A1* | 12/2006 | Asai et al. | 257/79 |
| 2006/0273339 A1* | 12/2006 | Steigerwald et al. | 257/99 |
| 2007/0131961 A1* | 6/2007 | Krames et al. | 257/103 |
| 2008/0197369 A1* | 8/2008 | Batres et al. | 257/98 |

* cited by examiner

HIGH LIGHT EFFICIENCY SOLID-STATE LIGHT EMITTING STRUCTURE AND METHODS TO MANUFACTURING THE SAME

CROSS REFERENCE TO RELATED APPLICATION

This patent application claims the benefit of U.S. provisional patent application No. 60/937,245 entitled "High Light Efficiency Solid-State Light Emitting Structure And Methods To Manufacturing The Same", filed on Jun. 25, 2007.

BACKGROUND OF THE INVENTION

Over the last decade, the advent of solid-state lighting has led to rapid advances in the production of high brightness Light Emitting Diodes (LEDs). LEDs hold the promise for a cost-effective solution for ever-increasing illumination-related energy needs. With advanced LED technology, the energy consumption can be reduced significantly.

LEDs brightness is now competing with incandescent and fluorescent light sources: larger chip-size and higher drive-current are keys to the latest improvements. Core-Technological breakthroughs, as well the innovative implementation of optical, electrical and thermal management methods have made these possible. Two aspects of these breakthroughs played a major role:
  Higher light extraction chip structures.
  Higher thermal-conductivity substrates.

The light extraction efficiency reflects the ability of photons emitted inside the LED chip to escape into the surrounding medium. For example, the index of refraction of Gallium phosphide-based materials is close to 3.4, compared with 1 for air and 1.5 for epoxy. This results in a critical angle of 17° for air and 25° in epoxy, respectively. If a single interface is considered only 2% of the incident light into air and 4% into epoxy will be extracted. As a comparison, the index of refraction of Gallium nitride-based materials is close to 2.3. This results in a critical angle of 26° into air and 41° into epoxy. If a single interface is considered only 5% of the incident light into air and 12% into epoxy will be extracted. The rest is reflected into the semiconductor where it will eventually be reabsorbed or recycled and results in the performance degradation of the device.

While light extraction efficiency is an important consideration in the design of LEDs, other factors may also be important. For example, to ensure that the entire active layer in the LED is utilized in light emission, it is desirable to spread the electrical current to the entire active layer. To enhance the efficient use of electrical current in light generation, the ohmic contact resistance with the LED should also be as low as possible. To enhance light extraction, the layers between the active layer and the emitting surface of the LED should have high light transmission characteristics. In addition, in order to efficiently reflect light generated by the active layer traveling in directions away from the light emitting surface of the LED, the different layers of the light reflector employed should have high index contrast.

One type of reflectors for LEDs is proposed in the paper "Omni-Directional Reflectors for Light-Emitting Diodes," by Jong Qyu Kim, et al. Proc. of SPIE Volume 6134, pages D-1 to D-12, 2006. In FIG. 5 of this paper, a GaInN LED with an omni-directional reflector (ODR) is shown. This LED structure comprises a sapphire substrate supporting a GaInN LED. A thin layer of oxidized Ruthenium (Ru) is used as a semi-transparent low-resistance p-type ohmic contact. A quarter-wave thick silicon dioxide low-refractive index layer perforated by an array of silver micro-contacts and a thick silver layer are also employed. In section 3.3.3 on page D-9 of this paper, however, the authors Kim, et al. indicated that the above structure of FIG. 5 is disadvantageous because the above design "needs absorptive semi-transparent current spreading layer, such as RuO2, . . . , which leads to a decrease in reflectivity of the ODR." Furthermore, the refractive index of silicon dioxide is deemed to be not low enough for high refractive index contrast with high-index semiconductor materials, which limits further improvement of light extraction efficiency in GaN-based LEDs.

As an alternative, the authors proposed an ODR structure illustrated in FIGS. 11 and 12 of the paper. In this alternative ODR structure, the oxidized Ruthenium and silicon dioxide layers in FIG. 5 are replaced by an indium-tin oxide (ITO) nanorod low index layer illustrated in FIG. 12 of the paper. However, as illustrated in FIG. 13 of the paper, the ITO nanorod layer provides mediocre ohmic contact characteristics. Moreover, the ITO material reacts strongly with metal, such as silver. When the ITO nanorod layer proposed by Kim, et al. comes into contact with a silver substrate underneath, interdiffusion occurs at the interface which greatly reduces the reflective properties of the resulting structure. This will also greatly reduce the light extraction efficiency of the LED. It is therefore desirable to provide an improved LED structure in which the above-described difficulties are alleviated.

Thermal management has always been a key aspect of the proper use of LEDs. Poor thermal management leads to performance degradation and reduced lifetime of LEDs. With High Power LEDs, the need is more compelling as more heat is generated.

A substrate of high thermal conductivity becomes a necessity. It allows heat generated at the chip level to be transferred efficiently away from the chip through the substrate.

Given that conventional red (AlGaInP) and blue (InGaN) LED are grown from N+ GaAs and sapphire substrates, respectively, one of the major drawbacks of GaAs and sapphire are their poor thermal conductivity. GaAs and sapphire have thermal conductivity values of 50, and 40 w/m° K roughly, respectively. Obviously, replacing GaAs or sapphire with a carrier of high thermal conductivity such as one made of Si (150 W/m° K) or Cu (400 W/m° K) can significantly improve the LED performance through better heat dissipation.

The substrate from which the LED is grown is referred to herein as the growth substrate. When the growth substrate is replaced by a substitute substrate, such as one made of Si or Cu, the LED epitaxial layers may be subject to change in stress conditions, which may damage the LED. This problem is explained, for example, in U.S. Pat. No. 7,105,857 ("the '857 patent"). As explained in the '857 patent, while the existence of stress per se may not damage the LED, a change in stress conditions may. This is illustrated, for example, in FIGS. 2A-4D of the '857 patent.

Thus, in the case of GaN-based LEDs grown from sapphire substrates, the fabrication process introduces considerable stress on the LED. When the sapphire substrates are replaced, the LEDs may be damaged if such stress is released rapidly. Stress management is thus an important issue. This is due to the fact that the materials in contact with one another in the fabrication process of LEDs have coefficients of thermal expansion (referred to herein as CTE) that can be very different. Hence, when the materials is processed so that they undergo large temperature changes, they will expand and contract by very different amounts. Since these materials are in intimate contact, this uneven expansion and contraction potentially introduce enormous stress in the LED fabricated.

The stress due to CTE mismatch can be calculated with the following equation:

$$\sigma = E(\alpha_1 - \alpha_2)(T - T_0)/(1 - \nu)$$

where σ is the stress, E is the Young's modulus, $\alpha_1$ and $\alpha_2$ are the CTE of metal such as Nickel and Copper etc. and epitaxial layer GaN, T and $T_0$ is the chip operating and process temperature such as die attach process (for example 250° C.), and ν is Poisson ratio (Nickel and GaN are 0.31 and 0.23, respectively). For example, sapphire has a CTE of 5.0-5.6, and GaN has a CTE of 5.6. While the CTEs of the two materials do not differ by much, during the fabrication process the temperature change is of the order of a thousand degrees, so that the compressive stress generated in the LED can be of the order of about −1.2 GPa.

Solutions have been proposed for stress management. In the '857 patent, for example, the materials with the appropriate CTE are chosen as explained in columns 3-5 of the '857 patent. Such technique, will however, limit the type of materials that can be used, which is not desirable.

It is therefore desirable to develop different stress management systems which does not have the above short comings.

SUMMARY OF THE INVENTION

Several different factors important in LED fabrication can all be taken into account in one embodiment of a solid state light emitting structure. In this embodiment, a LED comprising a plurality of semiconductor epitaxial layers is supported by a substitute substrate different from the growth substrate. A current spreading layer between the substitute substrate and the LED and in contact with said LED serves as an ohmic contact with the LED. A buffer layer between the current spreading layer and the substitute substrate comprises a plurality of vias and has a refractive index that is below that of the current spreading layer. A reflective metal layer between the buffer layer and the substitute substrate is connected to the current spreading layer through the vias in the buffer layer.

In the above embodiment, the buffer layer separates the current spreading layer from the reflective metal layer. In the event that the material of reflective metal layer reacts with that of the current spreading layer, the presence of a buffer layer reduces or prevents such reaction. This is the case, for example, where the current spreading layer comprises ITO. Moreover, since the buffer layer has a refractive index that is below that of the current spreading layer, this increases the index contrast of the reflective mirror formed by the buffer layer and the reflective metal layer, and enhances the reflectivity and thus the extraction efficiency of the LED device.

In another embodiment, a solid state light emitting structure that includes a LED comprising a plurality of semiconductor epitaxial layers grown on a growth substrate may be constructed as follows. A current spreading layer in contact with the LED is formed, where the current spreading layer serves as ohmic contact with the LED. A buffer layer is formed on the current spreading layer, wherein the buffer layer comprises a plurality of holes therein. The buffer layer has a refractive index that is below that of the current spreading layer. A reflective metal layer is formed on the buffer layer and the plurality of holes in the buffer layer are filled with an electrically conductive material to provide vias, so that the reflective metal layer is electrically connected to the current spreading layer through the vias. A substitute substrate in electrical contact with the reflective metal layer is provided to support said LED and the current spreading, buffer and reflective metal layers. In one implementation of the embodiment, the buffer layer comprises a dielectric material.

In yet another embodiment, stress management is provided by causing or preserving stress, such as compressive stress, in the LED so that stress (e.g. thermal stress) in the LED is reduced when it experiences thermal cycles. In one implementation of this embodiment, a solid state light emitting structure includes a LED comprising a plurality of semiconductor epitaxial layers with one or more interfaces between the epitaxial layers, wherein said layers expand or contract in response to temperature changes along one or more directions substantially parallel to the interfaces between the epitaxial layers. A substitute substrate different from the growth substrate supports the LED device. A reflective metal layer is provided between the LED and the substitute substrate. A layer is attached to the LED and reflective metal layer, and causes or preserves stress in the LED along the one or more directions so that stress in the LED is reduced in said one or more directions when temperature of the structure is increased. In some embodiments, this layer is referred to as the holding layer.

In still one more embodiment, a solid state light emitting structure that includes a LED comprising a plurality of semiconductor epitaxial layers grown on a growth substrate with interfaces between the epitaxial layers may be constructed as follows, where the semiconductor epitaxial layers expand or contract in response to temperature changes along one or more directions substantially parallel to the interfaces between the epitaxial layers. A substitute substrate different from the growth substrate is provided to support the LED. A reflective metal layer is formed between the LED and the substitute substrate. A layer is attached to the LED and reflective metal layer, where this layer causes or preserves stress in the LED along said one or more directions so that thermal stress in the LED is reduced in the one or more directions when temperature of the structure is increased.

The above features may be used individually or in combination.

All patents, patent applications, articles, books, specifications, standards, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

BRIEF DESCRIPTION OF THE DRAWINGS

FIGS. 1b-1g are views illustrating possible distributions of the vias in the solid state light emitting structure of FIG. 1a.

Identical components in this application are labeled by the same numerals.

DETAILED DESCRIPTION OF EXEMPLARY EMBODIMENTS

In some of the embodiments of the present invention, a light emitting structure is provided with high light extraction efficiency, as well as high thermal dissipation properties. The structure and manufacturing processes provide three major advantages when compared to existing structures and manufacturing methods:

1. A Composite Reflective Mirror is used to enhance the light extraction efficiency and total brightness output of the light-emitting device.
2. An innovative method is used to manage physical or mechanical stresses within the die structure. The light-emitting material is supported by a new substrate that has a different CTE than the active epi-layers of the device (i.e., the layers of the device that are grown using an epitaxial growth process). The substrate that supports the epi-layers is designed to provide robust mechanical support to the epi-layers as well as high thermal conductivity. This is accomplished by using a substrate or carrier material that has a built-in stress. Preferably the substrate or carrier material also has a CTE that has been tailored to keep the epi-layers under compressive lateral force.
3. A stress-free (from both mechanical and thermal stress) and cost-efficient method is used to separate the light emitting dies. A substrate attached to the epi-layers is specifically formed to allow a singulation process that is based on the use of wet chemical etching.

Figure 1A:
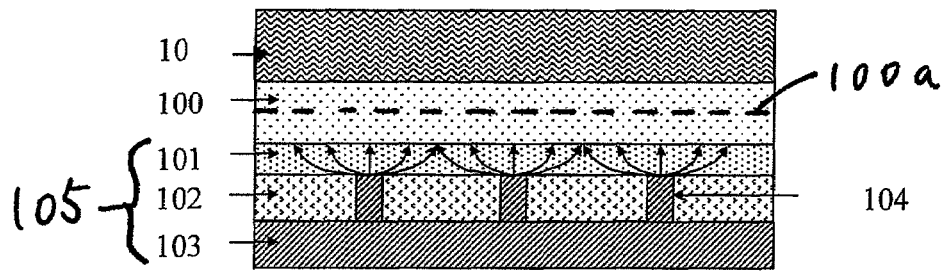
FIG. 1a is a cross sectional view of an LED with reflector layers of a solid state light emitting structure to illustrate an embodiment of the invention.

Composite Mirror:

The light emitting structure described in the present invention is a surface-emitting, solid-state light emitting structure, comprising a pn junction light-generating region 100 (referred to as the active area) in FIG. 1a, which region may include a p-doped layer and an n-doped layer. Region 100 is grown on a growth substrate 10 comprising a suitable material such as sapphire or GaAs.

Figure 2:
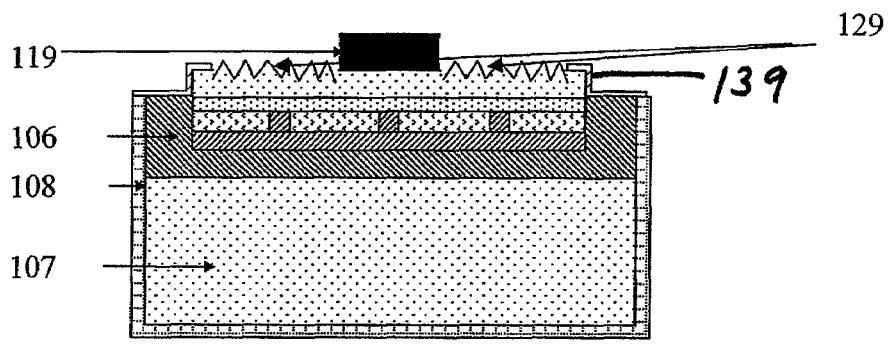
FIG. 2 is a cross sectional view of an LED with reflector layers, a substitute substrate and a housing in a solid state light emitting structure to illustrate an embodiment of the invention.

Light generated inside the active layers of a light emitting structure such as a light emitting diode is typically isotropically emitted within the epi-layers, meaning that photons are emitted in all directions, more or less equally. The portion of the emitted photons that is emitted in the upper hemisphere of the die is typically efficiently extracted from the device when proper surface texturing 129 is applied to the dies as illustrated in FIG. 2. However, the photons emitted in the lower hemisphere of the device typically reach the bottom interface of the device, and they need to be redirected toward the upper surface of the device at the surface texturing 129 to optimize the light extraction efficiency of the surface emitting device. FIG. 2 also shows the n side metal ohmic contact 119.

As illustrated in FIG. 1a, the reflecting structure of the present invention 105 includes the following features:

A contact layer 101 is preferably deposited on the p-doped region of the p and n epi-layers 100 to form an ohmic contact. This p-doped contact layer 101 may be formed by the deposition of a stochiometric Indium Tin Oxide layer (ITO). ITO is a good candidate as the p-contact layer, due to its ability to form an ohmic contact without annealing, its good electrical conductivity, optical transparency, and its relatively high refractive index ($\approx 1.9$). Anyone of the following materials or any combination of the following materials also exhibit the desired properties: ITO, Ni/Au and RuO2 for example.

Following deposition of the ITO p-contact layer 101, one or more dielectric layers 102 may be deposited in a sequence on the ITO layer. Localized openings are formed by means of photolithography used in semiconductor manufacturing through the insulating dielectric layer or layers 102 to form an electrical connection between the ITO layer 101 and the metal reflective layer 103.

The reflecting structure is finally capped with a reflective metal layer 103, which may be formed by a deposition process, which not only deposits the metal layer 103 onto the dielectric layer or layers 102, but also fills the openings or holes therein to form vias 104 shown in FIG. 1a.

Figure 1H:
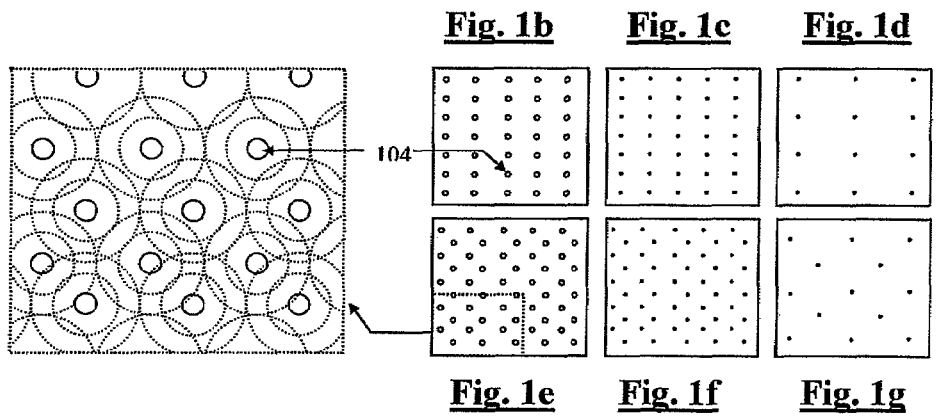
FIG. 1h is an exploded view of a portion of the distribution in FIG. 1e.

In prior devices, the ITO layer acts as a current-spreading layer for spreading current over the entire active region of the LED. In contrast, as illustrated in FIG. 1a, the ITO 101 provides current spreading between two adjacent holes only, not on the entire surface of the device. The lattice structure of the openings, the size of the openings and their diameter are preferably optimized for maximum light extraction efficiency. FIGS. 1b-1g illustrate different possible configurations of the openings or vias 104 network. FIG. 1h is an exploded view of a portion of the distribution in FIG. 1e.

In one embodiment of the present invention, the thickness of ITO ranges from 10 to 500 nm, the diameter of the openings or vias 104 ranges from 2 to 20 um and the spacing between vias ranges from 5 um to 100 um.

To obtain an optimal reflectivity of the structure, one important surface is the interface with the metallic layer 103. ITO deposition usually induces a rough surface morphology. Therefore the dielectric layers 102 will act as planarization layers and offers a smoother morphology at the interface with the metallic layer 103.

Moreover, ITO has a strong reactivity with metal layers. Even a superficial interdiffusion for example will greatly reduce the reflective properties of the reflective structure.

The structure presented in one embodiment of the present invention provides a solution that reduces the direct contact between the ITO in the reflective metal layers without significant degradation of the electrical properties of the light-emitting device. The dielectric layer or combination of dielectric layers 102 acts as a barrier between the ITO 101 and metal layers 103, and significantly improves the performance of the reflective mirror 105 as well as the reliability of the structure over time. The dielectric layer or layers may comprise material with a lower refractive index than the ITO layer, thereby improving the index contrast of the reflective mirror 105.

In addition, a well-tuned (to a specific optical wavelength range) combination or sequence of dielectric layers 102, combined with an adequately reflective metallic layer, provides an optimal total reflectivity. The resulting composite mirror structure 105 provides a significant performance improvement compared to the prior art. It provides a high reflectivity, low-resistance ohmic contact, composite-mirror structure.

Said dielectric layers 102 may be comprised of oxide(s), nitride(s) or fluoride(s) of any one or more of the following: Si, Nb, Ta, Al, In, Mg, Sn.

The reflective metal layer 103 can be any of the following or an alloy formed with any combination of the following: Au, Al, Ag, Ni, Cu, Pt, Pd, In.

Figure 3A:
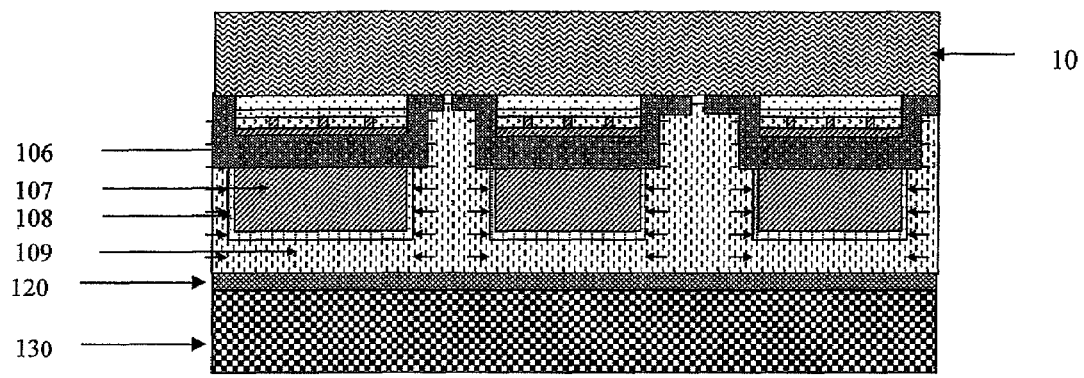
FIG. 3a is a cross sectional view of a plurality of LEDs, each with reflector layers, a substitute substrate and a housing in a solid state light emitting structure, where the LEDs are situated between a common growth substrate of the LEDs and a temporary support substrate to illustrate an embodiment of the invention.

FIG. 3a is a cross sectional view of a plurality of LEDs, each with reflector layers, a substitute substrate and a housing in a solid state light emitting structure, where the LEDs are situated between a common growth substrate of the LEDs and a temporary support substrate to illustrate an embodiment of the invention.

Figure 3B:
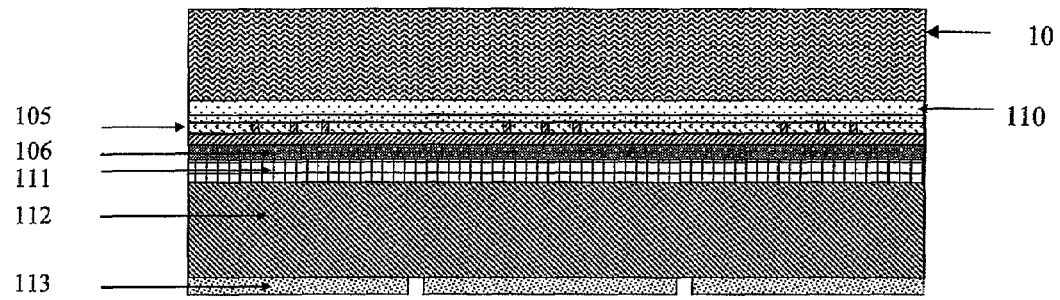
FIG. 3b is a cross sectional view of a plurality of LEDs, each with reflector layers, a substitute substrate in a solid state light emitting structure, where the LEDs are situated on a common growth substrate of the LEDs to illustrate another embodiment of the invention.

FIG. 3b is a cross sectional view of a plurality of LEDs, each with reflector layers, a substitute substrate in a solid state light emitting structure, where the LEDs are situated on a common growth substrate of the LEDs to illustrate another embodiment of the invention.

The reflective mirror 105 as described above is used in the plurality of LEDs in FIGS. 3a and 3b. The growth substrate 10 in both figures may comprise sapphire or GaAs for different wavelength LEDs respectively.

Figure 4:
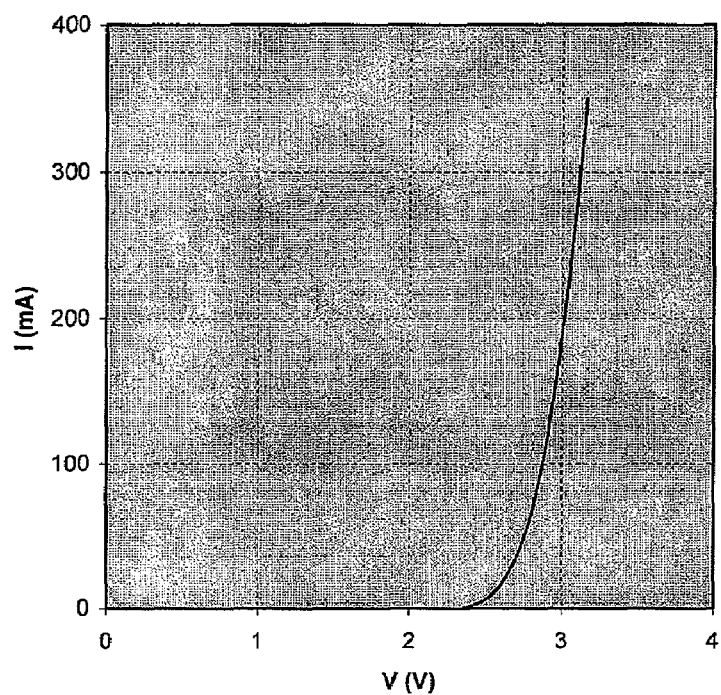
FIG. 4 is a graphical plot of the I-V characteristics of the LED with composite mirror of FIGS. 1a, 2, 3a and 3b.

FIG. 4 is a graphical plot of the I-V characteristics of the LED with composite mirror of FIGS. 1a, 2, 3a and 3b. As shown in FIG. 4, the composite mirror also has good I-V characteristics, so that the composite mirror does not degrade the function of the ITO as an ohmic p side contact to the LED active region 100. This is in contrast to the I-V characteristics shown in FIG. 13 of the paper by Kim et al. referenced above.

Figure 5:
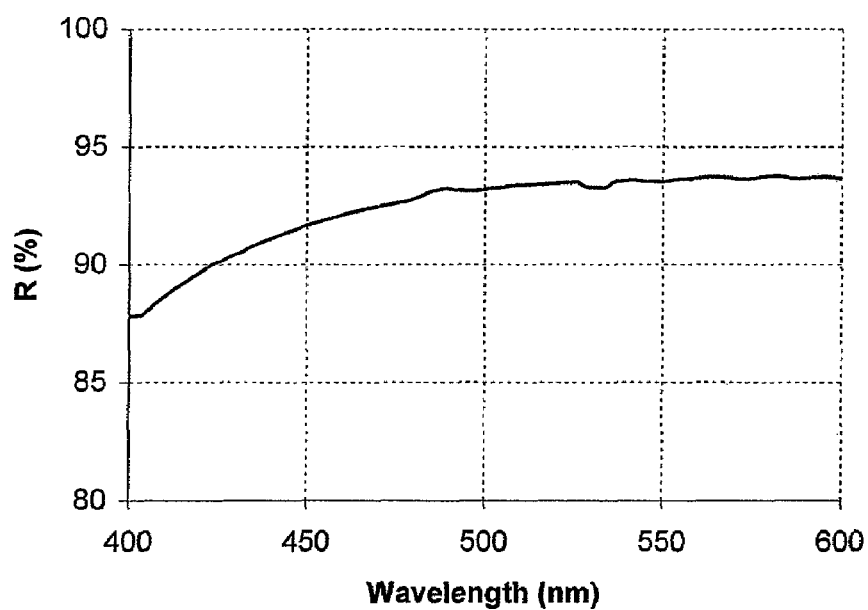
FIG. 5 is a graphical plot of the reflectivity of the composite mirror of FIGS. 1a, 2, 3a and 3b.

FIG. 5 is a graphical plot of the reflectivity of the composite mirror of FIGS. 1a, 2, 3a and 3b. As shown in FIG. 5, the composite mirror of FIGS. 1a, 2, 3a and 3b has good reflectivity over a range of wavelengths.

Stress Management:

The term carrier or substrate designates the supporting structure that is formed below the active epi-layers and composite mirror structure. As part of the overall device or die structure, it shapes its thermal dissipation properties, mechanical strength, and die attachment processes.

Following the formation of the composite mirror structure, a substitute supporting carrier or substrate is formed. The original epitaxial growth substrates (e.g. substrate 10 in FIG. 1a) on which III-V semiconductor epi-layers are usually grown have a low thermal conductivity. For example, the thermal conductivities of GaAs substrates and sapphire substrates are 50 W/m-degree C. and 40 W/m-degree C., respectively. Preferably the substitute supporting carrier or substrate has a thermal conductivity greater than about 60 W/m degrees Centigrade. As illustrated in FIG. 3a and FIG. 8b, the new carrier 107 for the thin film semiconductor film 100 has better heat dissipation characteristics than the original growth substrate. The substrate transfer method of the present invention allows a wide range of choice for the new carrier. The following table lists some candidate materials for such a carrier:

| Material | CTE at 25° C. (ppm/degree C.) | Thermal conductivity (W/m-degree C.) | Young's modulus (GPa) | Shear modulus (GPa) |
| --- | --- | --- | --- | --- |
| GaN | 5.6 | 130 | 290 | 67 |
| GaAs | 6.5 | 50 | 85.5 | 32.9 |
| Sapphire | 5.0-5.6 | 40 | 345 | 145 |
| Si | 4.1 | 150 | 107 | 64 |
| Cu | 17 | 400 | 131 | 48 |
| Ni | 13 | 91 | 200 | 76 |
| Cu—Mo—Cu | 6 | 182 | N/A | N/A |
| AlSiC | 6-16 | 170-220 | 188 | 76 |

As explained above, stress management when replacing an original growth substrate by a foreign or substitute substrate is an important aspect of the process and die structure design.

One embodiment of the present invention addresses the stress management issue in an innovative way. A compressive force is applied to the LED dies during processing and substrate transfer to result in a high-yield process.

One example of generating a compressive force in forming the substitute substrate 107 applied to the epitaxy layers by copper plating or electroplating (used interchangeably herein) is through heat-treating of copper plating at a higher temperature (e.g. 150-400 C) for certain time (e.g. 10-200 minutes) to cause the recrystallization of copper grains. The recrystallization of copper grains generates a stress free state at the heat-treating temperature and creates a compressive force against the epi-layers when cooled down to room temperature. The compressive force that is built in in the epi-layers prevents cracking of the chip during high temperature processing such as in a subsequent die bonding process.

Figure 6:
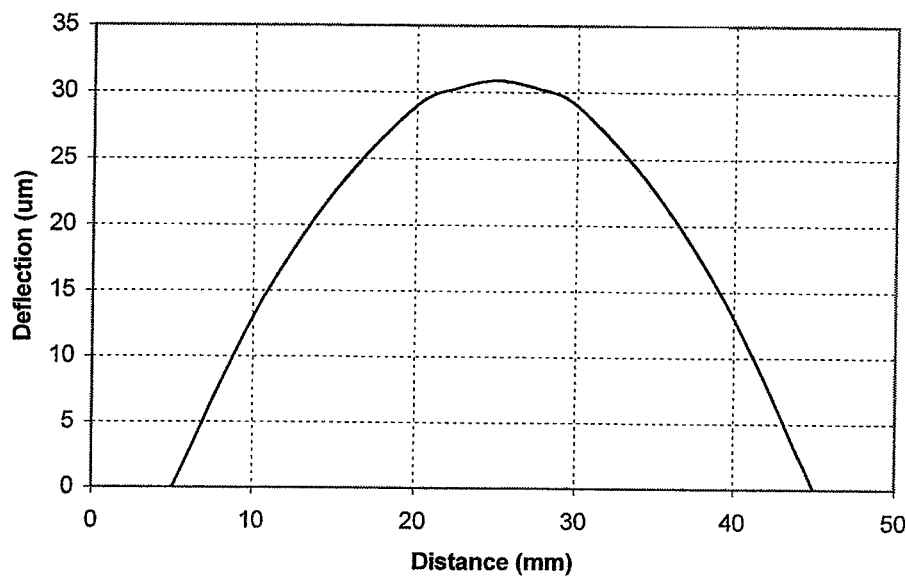
FIG. 6 is a graphical plot of the curvature of GaN grown on sapphire substrate useful for illustrating an embodiment of the invention.

Another example of generating a compressive force against a GaN-based epitaxy layers is using a high modulus plating material such as nickel or Cr to prevent the release of the compressive force when the sapphire wafer is removed from the GaN-based epitaxy layers. It is well known that the GaN-based epitaxy layers grown on sapphire wafers are under high compressive force at room temperature due to the CTE mismatch between GaN-based epitaxy layers and sapphire. FIG. 6 is a graphical plot of the curvature of GaN grown on sapphire substrate useful for illustrating this effect.

A layer 106 of high shear modulus plating material such as Ni or Cr, or an alloy thereof, that is strongly bonded to the GaN-based epitaxy layers will prevent the release of the compressive force during the laser lift-off and other thermal processes. The high modulus plating material not only maintains the compressive force that is built in the GaN-based epitaxy layer but also provides high yield during the laser lift-off sapphire removing process and the process of chip bonding to the LED package. In general a material having a shear modulus greater than about 60 GPa may be used for layer 106.

The method of the present invention prevents the reversal or transition of the overall stress from compressive to tensile, by applying an initial, built-in compressive stress to the LED dies that cannot be reversed during subsequent device processing or operation. The dies are built so that the compressive stress can only be released at temperatures that exceed normal die attach and die operational conditions.

When the GaN based LED die or chip reaches 250° C., the thermal stress due to CTE mismatch between GaN and Nckel etc. is 0.49 GPa. Therefore, in order to hold the stress in GaN (−1.2 GPa) during laser lift off process to remove sapphire substrate and minimize the impact of thermal stress during die attach process, the rigid metal such as Nickel and pre-built-in stress using annealing process are applied in the device structure 100 to avoid chip cracking. While a layer 106 bonded to the LED 100 on one side may be adequate to maintain the pre-built-in stress as shown in the configuration of FIG. 3b, preferably, the layer 106 has the shape of a housing that is bonded to the LED also on certain other sides of the LED epitaxial structure, in the manner shown in FIG. 3a.

As shown in FIG. 1, the LED epitaxial structure 100 comprises at least one interface 100a between the epitaxial layers; there will be more than one interface if structure 100 contains more than 2 layers. When the epitaxial structure 100 expands or contracts due to temperature changes, the greatest change in dimensions of the structure 100 will be along directions that are parallel to the interface 100a between the epitaxial layers. Hence, in order to maintain the pre-built-in stress, preferably this is done by reducing the amount by which the structure 100 can change in dimensions along directions that are parallel or substantially parallel to the interface 100a. Where layer 106 has a portion that forms an enclosed ring surrounding the LED 100 where the surface of this portion is transverse (e.g. perpendicular) to the interface 100a as shown in FIG. 3a, then the layer 106 will be more effective in accomplishing this result.

Instead of or in addition to maintaining pre-built-in stress, layer 106 may also be formed to introduce compression stress, such as by recrystallization of copper grains in the manner described above. Such and other variations may be used.

In one embodiment of the present invention, the supporting substrate is directly bonded to the structure that is formed by the epi-layers and the composite mirror. FIG. 3b illustrates this structure. An adhesion layer, a wetting layer, as well as a high-modulus strengthening layer 106 are formed prior to the attachment of the carrier. The bonding layers 111 may be initially formed on the wafer, on the carrier or both. The materials for the bonding layer 111 preferably have low melting temperature and low Young's Modulus (i.e. high ductility) such as Tin, Lead, Indium, Sn/Au alloy, etc. A new carrier 107' is then attached to the substrate using the method described in patent application US20060237735. A back-side metallization 113 is then formed on the backside of the new substrate. This metallization may be patterned using optical lithography or physical masking, referred to as "shadowing", to match the dimensions of the devices.

In another embodiment of the present invention illustrated in FIG. 3a, the substrate 107 is formed by the electro-plating of high thermal conductivity materials. By tailoring the electro-plating conditions as well as the composition of the electro-plated materials (suitable materials include Au, Ni, and Cu), a built-in compressive stress is applied to the epi-layers 100. An adhesion and strengthening layer 106 is thus formed below the composite mirror structure 105, and surrounding the structures 105 and 100. This layer 106 provides a rigid support to the epilayers 100. The material forming this layer is chosen to ensure that a high etch-selectivity with the epilayer 100 as well as the layer 107 as explained in more detail below.

A highly thermally conductive layer 107 is subsequently formed. This layer 107 is the main body of the substrate and its thickness typically ranges between 30 and 200 um.

Finally, a layer 108 preferably comprising a material of high shear modulus (e.g. Ni or Cr or an alloy of both) is formed and encapsulates the new supporting structure 107 of the LED chip or die. This layer 108 will be the outer layer of the die after removal of the temporary layer 109.

As shown in FIG. 3a, a plurality of LEDs are fabricated at the same time. First the n and p epitaxial layers are grown on the growth substrate 10 to form the LEDs. Then the mirror layers 105 are formed on the epitaxial layers of each of the LEDs, followed by formation of the layers 106, 107 and 108 on each of the LED structures. Finally layer 109 (e.g. Cu) is formed and connects the individual epitaxial dies. The LED dies are then bonded to a common temporary substrate 130 by polymer 120 to form the entire structure in FIG. 3a.

While not shown in FIG. 3b, the structure shown therein may also be bonded to a common temporary substrate 130 by polymer. The resulting structures from both FIGS. 3a and 3b are then ready for the next step in the fabrication process.

The carrier formed by direct bonding as in FIG. 3b or by plating as in FIG. 3a has the following properties:

A high thermal conductivity that allows efficient heat transport away from the active area.

A back-side metallization that may be formed with Ti, Pt, Ni, or Au, making the device suitable for typical die attach processes.

A level of structural rigidity that allows easy handling of the resulting singulated devices and that ensures the integrity of the devices The carrier may be composed of one or more of the following materials: Si, GaAs, Cu, Al, SiC, AlSiC, Cu/M or Cu/M/Cu (where M is Mo or W), Graphite, and AlN After formation of the new supporting substrate and bonding to the common temporary substrate, the growth substrate 10 is removed by one of the following methods or a combination of them: wet etching, mechanical grinding, or Laser Lift-Off or LLO. The laser Lift-Off process is a process using selective absorption of a laser radiation to separate the epi-layers from the epitaxial substrate. For example, a pulsed UV-laser is shined through the epitaxial sapphire substrate. The wavelength of the laser radiation is chosen so that the AlInGaN epi-layers absorb the radiation but not the substrate. This absorption leads to a high-temperature decomposition of the epilayers-substrate interface. In the case of AlInGaN epi-layers on a sapphire substrate, the decomposition process generates a plasma creating a surpressure of N2 gas and leaving a thin layer of Ga metal behind (melting temperature<30° C.), which allows easy separation of the sapphire substrate. As noted above, heat generated by this process may cause temperature of the LEDs to rise significantly, so that CTE mismatch may cause damage to the LEDs unless the change in stress conditions is managed successfully.

Finally, formation of the upper electrode 119 for the n ohmic contact, surface texturing 129, and passivation layer 139 shown in FIG. 2 are performed to increase the light extraction efficiency of the surface emitting device. The structures that result from the above processes from those shown in FIGS. 3a and 3b are illustrated in FIGS. 7a and 7b respectively.

The surface texturing 129 can improve the light extraction greatly because the light has less chance to be totally internal reflected from the well-designed textured surface. The surface texturing methods can be wet etching and photo electro-chemical (PEC) techniques to reveal the crystal structure or using dry etching to form the pattern. The texture size and angle can be tuned to maximize the light extraction.

Figure 7A:
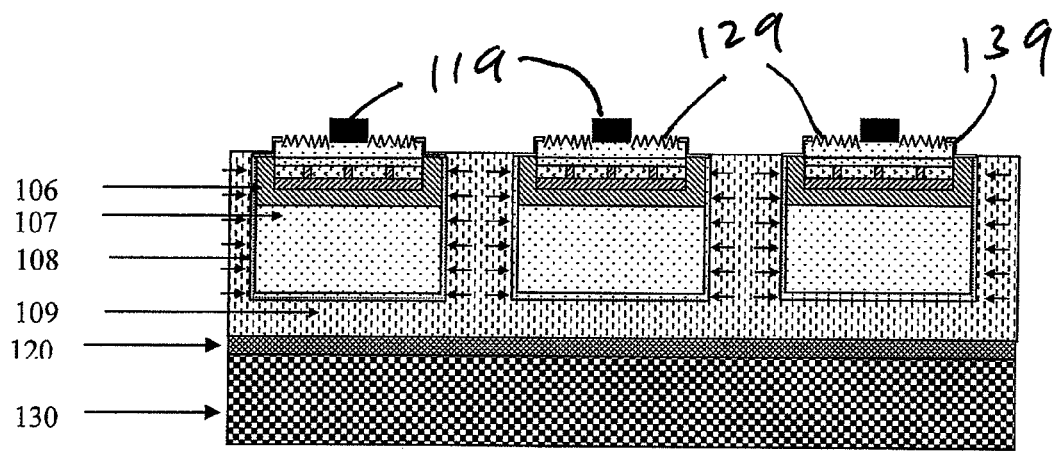
FIGS. 7a and 7b are cross sectional views of a plurality of LEDs which have been further processed from the LED structures shown in FIGS. 3a and 3b respectively after the growth substrate has been removed but before singulation useful for illustrating an embodiment of the invention.
Figure 7B:
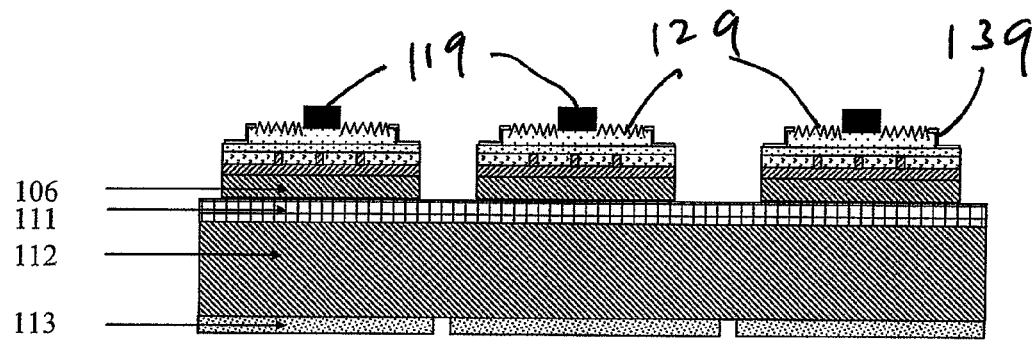

Stress-Free Singulation:

After die processing is completed at the wafer level, the wafer as illustrated in FIGS. 7a and 7b is peeled off from the temporary support 130 through the polymer bonding material 120, and then bonded mounted on a standard dicing or blue tape material 110.

It is noted that the epi-layers 101 can be attached to the dicing tape 110 or that the backside of the device might be bonded to the dicing tape.

The manufacturing process described above is designed to allow a singulation process that uses wet etching, thereby avoiding the mechanical and other stresses which may accompany other singulation processes such as die sawing or laser dicing.

The etching can be performed from either side of the devices. The singulation methods described in the prior art include mechanical dicing/sawing, laser dicing, or a combination of both.

The singulation process of the present invention is a cost-effective method in which wet etching is used to remove materials based on the etch-selectivity of the constituents of the substrate. For example, where Ni is used to form the layer 106, it may be used as an etch stop, since the wet etching can be designed to preferentially etch away copper 109 without significantly affecting the Ni layer 106. Furthermore, the absence of the mechanical stresses or smearing that are typically encountered with mechanical dicing processes, and the absence of the Heat Affected Zone that is typical of laser dicing processes, provides significant advantages over these two methods.

The method of the present invention is adapted to a particular type of substrate that is designed to withstand the chemical etching process. Similarly, the properties of the etchant are tailored to match the materials of the substrate. In one embodiment of the present invention, the material removed by the chemical etching process is Cu or Ni and the etch barrier that protects the individual dies is Au, Ni or Sn.

In another embodiment of the present invention, the structure formed below the epi-layers (the composite mirror plus the supporting carrier) is encapsulated with a material that has a high etch selectivity with respect to the etchant that is used to remove the material that is connecting the different dies.

Figure 9:
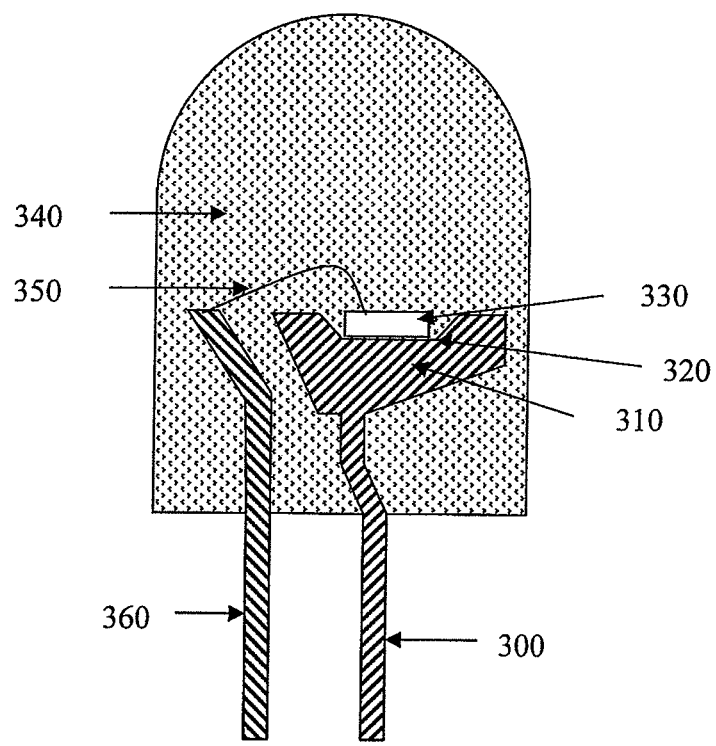
FIG. 9 is a cross sectional view of a complete LED device comprising a LED chip in a LED package.
Figure 8A:
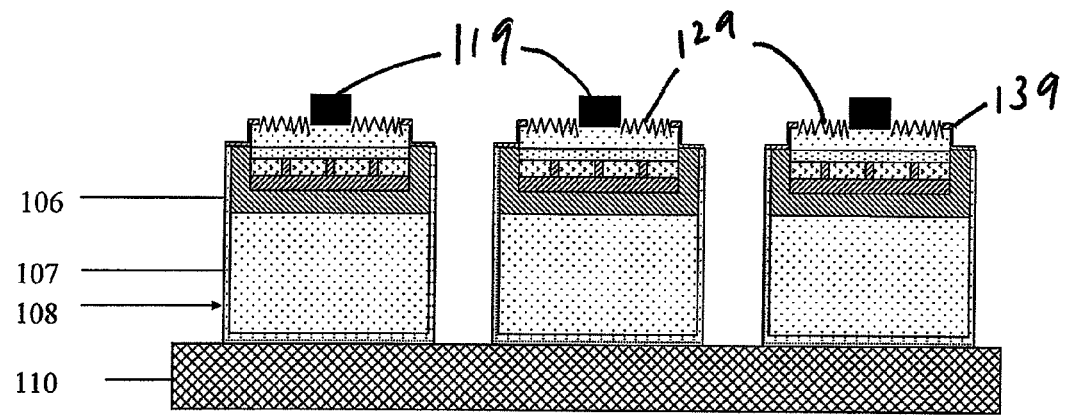
FIGS. 8a and 8b are cross sectional views of a plurality of LEDs which have been further processed by singulation from the LED structures shown in FIGS. 7a and 7b respectively.
Figure 8B:
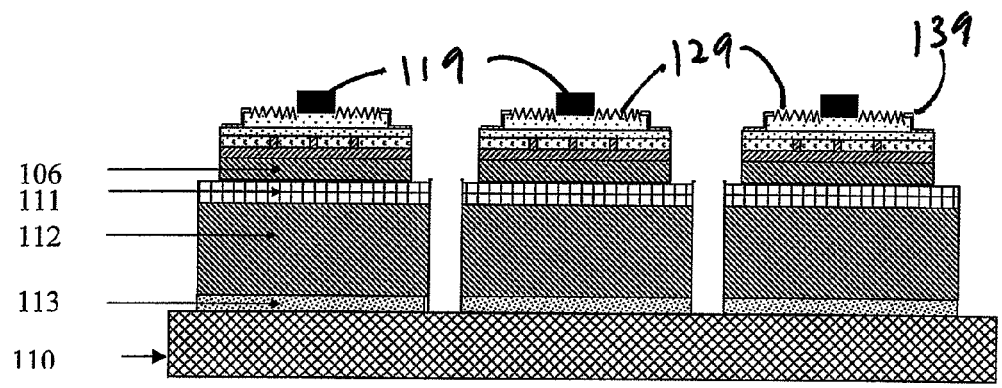

After singulation of the wafer into individual LED devices, the LED devices that result from the structures of FIGS. 7*a* and 7*b* are shown in FIGS. 8*a* and 8*b* respectively. The LED devices are then removed from tape 110. Each LED device is then attached to a package as shown in FIG. 9. As noted above, the chip bonding process may cause the temperature of the LED device to rise significantly. In FIG. 9, 300 is the anode to connect to the p-side on the chip 330 to the reflective cup 310 with die attach at high temperature with solder layer 320 such as (Sn, Au/Sn etc), 360 is the cathode to connect to the n-metal on the chip with wire 350 (bonding wire).

340 is the epoxy lens.

Figure 10:
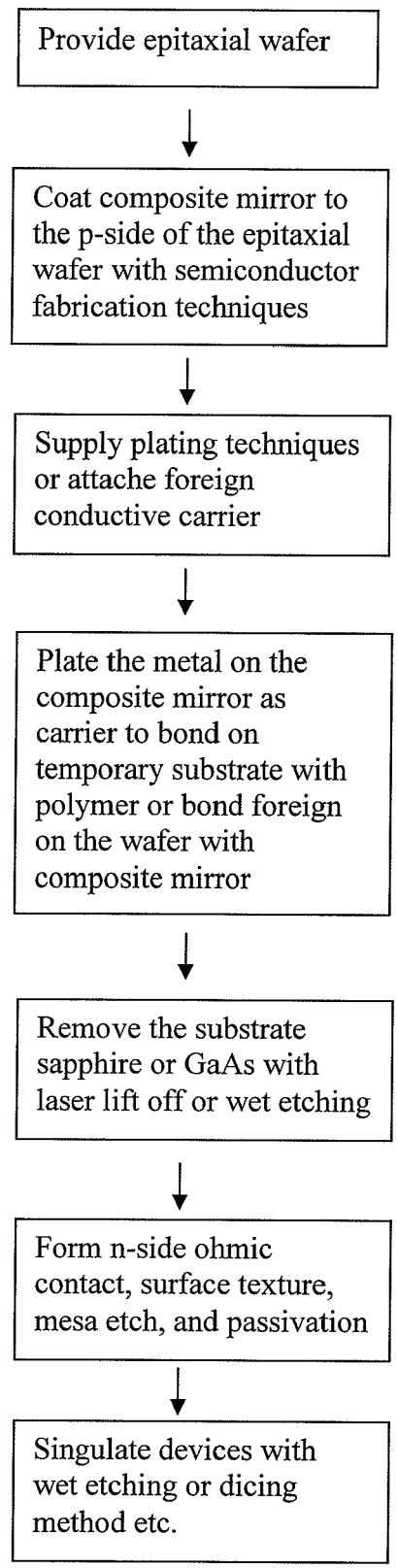
FIG. 10 is a flow chart illustrating a process for making LEDs useful for illustrating an embodiment of the invention.

The process for making the LEDs is illustrated in the flow chart of FIG. 10.

The above features and additional features of various embodiments are illustrated in the table below:

Various Features of Different Embodiments

| A. Omni directional reflector + Laser Lift-Off | B. Stress Management | C. Chip structure designed for Wet etching singulation of dies |
|---|---|---|
| 1. ITO used to create ohmic contact to p-type material<br>2. Thickness of ITO reduced or minimized to provide current spreading on an area between 2 openings of the dielectric layer.<br>3. The thickness of the ITO layer is adjusted to compromise and optimize the following:<br>Reflectivity of the overall mirror.<br>Ohmic-contact properties<br>Current spreading<br>Transparency | 1. Stress management of the chip structure to sustain substrate transfer (For example LLO)<br>2.<br>3. Layer thickness and arrangement: continuous rigid Ni, high thermal conductivity Cu e.g.<br>4. Pre-stressed chip structure. Material deposited (sputtering, ion beam, electro-plating, electroless plating) + composition tuning<br>Deposition method conditions: (deposition rate, temperature . . . )<br>5. Thermal anneal to generate compressive force (Inherent compressive force applied to GaN after growth on Sapphire).<br>6. Use of a polymer between the chip support formed by electroplating at wafer level, Polymer has much larger CTE than metals and ceramic such AlInGaN alloys, polymer will provide compressive force on metal-ceramic structure.<br>7. Mechanical dicing generates smear | 1. LED structure designed so that singulation can be performed with a Process that does not involve heat and or mechanical process-related stress:<br>Mechanical dicing generates smear<br>Laser cutting generates melting (shorting potential)<br><br>2. Cost effective process:<br>3. Formation of a substrate by electroplating:<br>having thinner recesses or grooves between chips<br>of a substrate comprising a chip support, an encapsulation layer that will not be etched away and a subsequent layer that will be removed during die separation by wet etching.<br>Formation of a wafer level structure: |

-continued

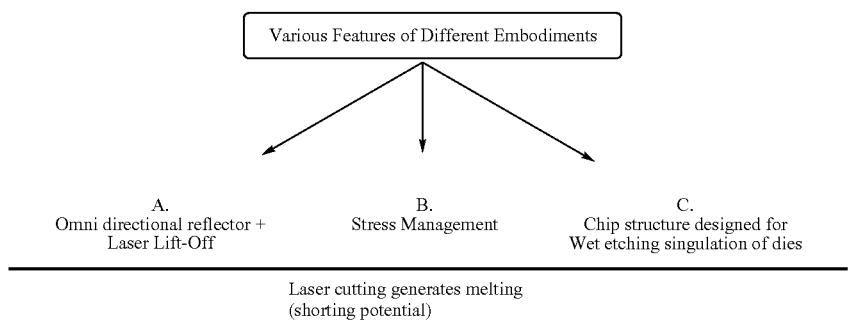

Laser cutting generates melting
(shorting potential)

While the invention has been described above by reference to various embodiments, it will be understood that changes and modifications may be made without departing from the scope of the invention, which is to be defined only by the appended claims and their equivalents.

What is claimed is:

1. A solid state light emitting structure comprising:
    a LED comprising a plurality of semiconductor epitaxial layers, said semiconductor epitaxial layers having been grown on a growth substrate;
    a substitute substrate different from the growth substrate supporting said LED and having a thermal conductivity that is higher than that of the growth substrate;
    a current spreading layer between the substitute substrate and the LED, said current spreading layer in contact with said LED serving as ohmic contact with the LED; and
    a buffer layer between the current spreading layer and the substitute substrate, said buffer layer comprising a plurality of vias, said buffer layer having a refractive index that is below that of the current spreading layer; and
    a reflective metal layer between the buffer layer and the substitute substrate, said reflective metal layer connected to the current spreading layer through vias in the buffer layer.

2. The structure of claim 1, said substitute substrate comprising a metallic material.

3. The structure of claim 1, said current spreading layer is any one of the following or any combination of the following: ITO, Ni/Au, and RuO$_2$.

4. The structure of claim 1, said buffer layer comprising a dielectric material.

5. The structure of claim 1, said buffer layer comprising a plurality of vias.

6. The structure of claim 1, said reflective metal layer is any one of the following or any combination of the following: Au, Al, Ag, Ni, Cu, Pt, and Pd.

7. The structure of claim 1, said substitute substrate comprising a material with thermal conductivity greater than about 60 W/m degrees Centigrade.

8. A solid state light emitting structure comprising:
    a LED comprising a plurality of semiconductor epitaxial layers with at least one interface between the epitaxial layers, wherein said layers expand or contract in response to temperature changes along one or more directions substantially parallel to the interface between the epitaxial layers; a substitute substrate different from a growth substrate supporting said LED device;
    a reflective metal layer between the LED and the substitute substrate; and
    a holding layer attached to said LED and said reflective metal layer, said holding layer causing or preserving stress in said LED along said one or more directions so that stress in the LED is reduced in said one or more directions when temperature of the structure is increased, said holding layer made of a material with shear modulus greater than about 60 GPa.

9. A solid state light emitting structure comprising:
    a LED comprising a plurality of semiconductor epitaxial layers with at least one interface between the epitaxial layers, wherein said layers expand or contract in response to temperature changes along one or more directions substantially parallel to the interface between the epitaxial layers; a substitute substrate different from a growth substrate supporting said LED device;
    a reflective metal layer between the LED and the substitute substrate; and
    a holding layer attached to said LED and said reflective metal layer, said holding layer causing or preserving stress in said LED along said one or more directions so that stress in the LED is reduced in said one or more directions when temperature of the structure is increased, said holding layer comprising Ni or Cr, or an alloy of Ni and Cr.

* * * * *